United States Patent
Matsumoto et al.

(10) Patent No.: US 9,330,881 B2
(45) Date of Patent: May 3, 2016

(54) BLANKING DEVICE FOR MULTI CHARGED PARTICLE BEAMS, AND MULTI CHARGED PARTICLE BEAM WRITING APPARATUS

(71) Applicant: NuFlare Technology, Inc., Yokohama (JP)

(72) Inventors: Hiroshi Matsumoto, Yokohama (JP); Hirofumi Morita, Setagaya-ku (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/828,681

(22) Filed: Aug. 18, 2015

(65) Prior Publication Data

US 2016/0064178 A1    Mar. 3, 2016

(30) Foreign Application Priority Data

Sep. 1, 2014 (JP) ................................. 2014-177560
Jul. 28, 2015 (JP) ................................. 2015-148976

(51) Int. Cl.
*H01J 37/04* (2006.01)
*H01J 37/317* (2006.01)

(52) U.S. Cl.
CPC ............ *H01J 37/045* (2013.01); *H01J 37/3177* (2013.01)

(58) Field of Classification Search
USPC ......................................... 250/396 R, 492.22
See application file for complete search history.

(56) References Cited

U.S. PATENT DOCUMENTS

| 5,214,289 | A  | * | 5/1993  | Betsui ................... | H01J 37/045 |
|           |    |   |         |                          | 250/396 R   |
| 6,291,940 | B1 | * | 9/2001  | Scholte Van Mast .       | H01J 37/045 |
|           |    |   |         |                          | 250/492.23  |
| 2008/0203317 | A1 | * | 8/2008 | Platzgummer ......... | B82Y 10/00 |
|           |    |   |         |                          | 250/396 R   |
| 2010/0288938 | A1 |   | 11/2010 | Platzgummer          |             |

FOREIGN PATENT DOCUMENTS

JP    2005-136114    5/2005
JP    2010-267962    11/2010

* cited by examiner

*Primary Examiner* — Kiet T Nguyen
(74) *Attorney, Agent, or Firm* — Oblon, McClelland, Maier & Neustadt, L.L.P.

(57) ABSTRACT

A blanking device for multi-beams includes a substrate, a dielectric film formed on the substrate, plural first electrodes, at positions each exposed in a corresponding opening, to be applied with a first deflection potential, plural second electrodes, at positions each opposite to a corresponding first electrode with respect to the corresponding opening, to be applied with a second deflection potential, including a ground potential, for deflecting a corresponding beam of the multi-beams by a difference between the first and second deflection potentials, and a conductive film arranged in, other than plural first regions on the dielectric film each along a corresponding first electrode and being shaded by each first electrode in a case of being viewed from a position where a corresponding beam passes through a corresponding opening, a second region on the dielectric film, wherein insulation is provided between the plural first and second electrodes.

11 Claims, 9 Drawing Sheets

BLANKING DEVICE FOR MULTI CHARGED PARTICLE BEAMS, AND MULTI CHARGED PARTICLE BEAM WRITING APPARATUS

CROSS-REFERENCE TO RELATED APPLICATION

This application is based upon and claims the benefit of priority from the prior Japanese Patent Application No. 2014-177560 filed on Sep. 1, 2014 in Japan, and the prior Japanese Patent Application No. 2015-148976 filed on Jul. 28, 2015 in Japan, the entire contents of which are incorporated herein by reference.

BACKGROUND OF THE INVENTION

1. Field of the Invention

Embodiments of the present invention relate generally to a blanking device for multi charged particle beams, and a multi charged particle beam writing apparatus, and more specifically, to a blanking device to be mounted in a multi-beam writing apparatus, for example.

2. Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is decreasing year by year. The electron beam (EB) writing technique, which intrinsically has excellent resolution, is used for writing or "drawing" a pattern on a wafer, etc. with electron beams.

As an example employing the electron beam writing technique, a writing apparatus using multiple beams (multi-beams) can be cited. Compared with the case of writing a pattern by using a single electron beam, since it is possible to emit multiple beams at a time (one shot) in multi-beam writing, the throughput can be greatly increased. For example, in a writing apparatus employing a multi-beam system, multi-beams are formed by letting portions of an electron beam emitted from an electron gun assembly pass through a corresponding hole of a plurality of holes in the mask, a blanking control is provided for each of the beams, and each unblocked beam is reduced by an optical system and deflected by a deflector so as to irradiate a desired position on a target object or "sample".

In multi-beam writing, the dose of each beam is separately controlled based on an irradiation time. For highly accurately controlling such a dose of each beam, it is necessary to perform high speed blanking control to provide an ON or OFF state of each beam. In a writing apparatus of a multi-beam system, there is mounted a blanking plate where passage holes for multi-beams are formed, and at the circumference of each of the passage holes, a pair of blanking electrodes (blanker) and a blanking control circuit (LSI circuit) for each of the multi-beams are arranged. Using the MEMS (Micro Electro Mechanical Systems) technique, the blanking plate is fabricated by forming the passage holes, a plurality of pairs of blanking electrodes, etc. on a silicon (Si) substrate. Conventionally, insulators are exposed on the upper surface of the blanking plate. Therefore, the insulators on the upper surface are charged when beams irradiate the surface, thereby resulting in beam distortion or blur. Moreover, an overvoltage occurs in the blanking electrode because of the charging, which causes breakage of the blanking control circuit formed on the blanking plate.

There is disclosed a blanking plate whose surface is covered with a metal film and in which bonding connection using indium (In) is provided between a multi-beam deflector array means, on the surface of which a metal pad is formed, and a silicon electrode, which is positioned/installed completely independently of the main body of the multi-beam deflector array means (e.g., refer to Japanese Patent Application Laid-open (JP-A) No. 2010-267962). In this disclosure, a dielectric film is exposed over the whole circumference of the electrode, including the opening side through which beams pass. Therefore, the possibility remains that beam charging occurs in the dielectric film portion at the opening side.

BRIEF SUMMARY OF THE INVENTION

According to one aspect of the present invention, a blanking device for multi charged particle beams includes a substrate in which there are formed a plurality of openings through each of which a corresponding beam of multi-beams passes, a dielectric film formed on the substrate, a plurality of first electrodes, located at an upper side of the dielectric film and arranged at positions each exposed in a corresponding opening of the plurality of openings, each configured to be applied with a first deflection potential for blanking deflection of the corresponding beam of the multi-beams, a plurality of second electrodes, located at the upper side of the dielectric film and arranged at positions each opposite to a corresponding first electrode of the plurality of first electrodes with respect to the corresponding opening of the plurality of openings, each configured to be applied with a second deflection potential, including a ground potential, for deflecting the corresponding beam of the multi-beams by a potential difference between the first deflection potential and the second deflection potential, and a conductive film arranged in, other than a plurality of first regions on the dielectric film each along a corresponding first electrode of the plurality of first electrodes and being shaded by the each of the plurality of first electrodes in a case of being viewed from a position where the corresponding beam passes through the corresponding opening of the plurality of openings, a second region on the dielectric film, wherein insulation is provided between the each of the plurality of first electrodes and the plurality of second electrodes by combination of the dielectric film and the corresponding opening.

According to another aspect of the present invention, a multi charged particle beam writing apparatus includes a stage configured to mount a target object thereon and to be continuously movable, an emission unit configured to emit a charged particle beam, an aperture member, in which a plurality of openings are formed, configured to form multi-beams by making a region including a whole of the plurality of openings irradiated by the charged particle beam and letting portions of the charged particle beam respectively pass through a corresponding opening of the plurality of openings, a blanking device including a substrate in which there are formed a plurality of openings through each of which a corresponding beam of multi-beams passes, a dielectric film formed on the substrate, a plurality of first electrodes, located at an upper side of the dielectric film and arranged at positions each exposed in a corresponding opening of the plurality of openings, each configured to be applied with a first deflection potential for blanking deflection of the corresponding beam of the multi-beams, a plurality of second electrodes, located at the upper side of the dielectric film and arranged at positions each opposite to a corresponding first electrode of the plurality of first electrodes with respect to the corresponding opening of the plurality of openings, each configured to be applied with a second deflection potential, including a ground potential, for deflecting the corresponding beam of the multi-beams by a potential difference between the first deflection potential and the second deflection potential, and a conductive film arranged in, other than a plurality of first regions on the dielectric film each along each of the plurality of first electrodes and being shaded by the each of the plurality of first electrodes in a case of being viewed from a position where the corresponding beam passes through the corresponding opening of the plurality of openings, a second region on the dielectric film, wherein insulation is provided between the each of the plurality of first electrodes and the plurality of second electrodes by combination of the dielectric film and the corresponding opening, and a blanking aperture member configured to block each beam of the multi-beams which has been deflected to be in an OFF state by the plurality of first electrodes and the plurality of second electrodes of the blanking device.

DETAILED DESCRIPTION OF THE INVENTION

In the following embodiments, there will be described a blanking device capable of suppressing electrification (charging) of the surface caused by beam irradiation.

In the following embodiments, there will be described a configuration in which an electron beam is used as an example of a charged particle beam. The charged particle beam is not limited to the electron beam, and other charged particle beam such as an ion beam may also be used.

First Embodiment

Figure 1:
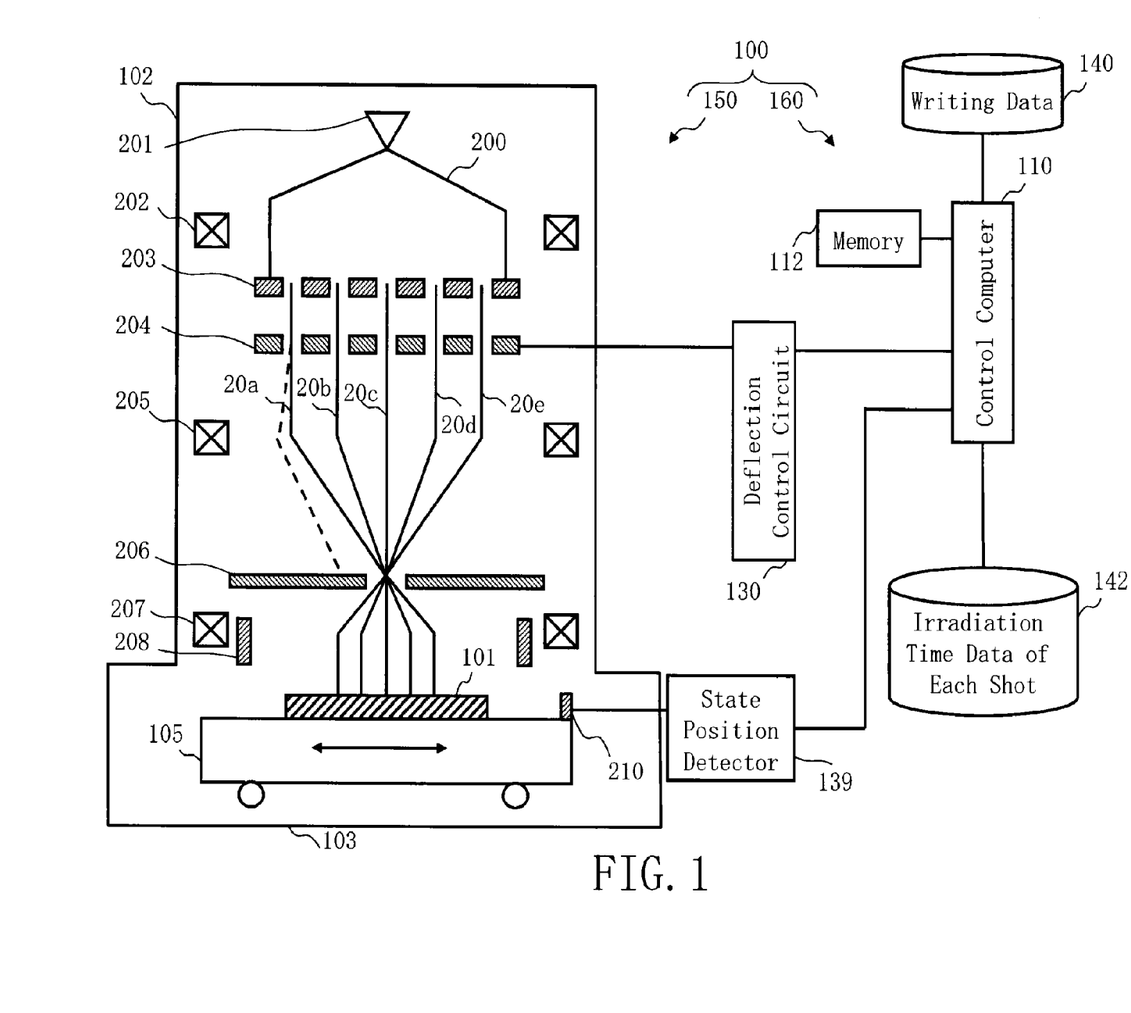
FIG. 1 is a schematic diagram showing a configuration of a writing apparatus according to the first embodiment.

FIG. 1 is a schematic diagram showing a configuration of a writing or "drawing" apparatus according to a first embodiment. As shown in FIG. 1, a writing apparatus 100 includes a writing unit 150 and a control unit 160. The writing apparatus 100 is an example of a multi charged particle beam writing apparatus. The writing unit 150 includes an electron optical column 102 and a writing chamber 103. In the electron optical column 102, there are arranged an electron gun assembly 201, an illumination lens 202, an aperture member 203, a blanking plate 204, a reducing lens 205, a limiting aperture member 206, an objective lens 207, and a deflector 208. In the writing chamber 103, an XY stage 105 is arranged. On the XY stage 105, there are placed a Faraday cup 106 and a target object or "sample" 101 such as a mask blank serving as a writing target substrate when writing is performed. For example, the target object 101 is an exposure mask used for manufacturing semiconductor devices, or is a semiconductor substrate (silicon wafer) on which semiconductor elements are formed. The target object 101 may be, for example, a mask blank on which resist has been applied and nothing has yet been written. Moreover, a mirror 210 for measuring the position of the XY stage 105 is arranged on the XY stage 105.

The control unit 160 includes a control computer 110, a memory 112, a deflection control circuit 130, a stage position detector 139, and storage devices 140, and 142 such as magnetic disk drives. The control computer 110, memory 112, deflection control circuit 130, stage position detector 139, and storage devices 140 and 142 are mutually connected through a bus (not shown). Writing data is input from the outside to the storage device 140 (storage unit) to be stored therein.

Data which is input and output to/from the control computer 110, and data being operated are stored in the memory 112 each time.

FIG. 1 shows a configuration necessary for explaining the first embodiment. Other configuration elements generally necessary for the writing apparatus 100 may also be included.

Figures 2A, 2B:
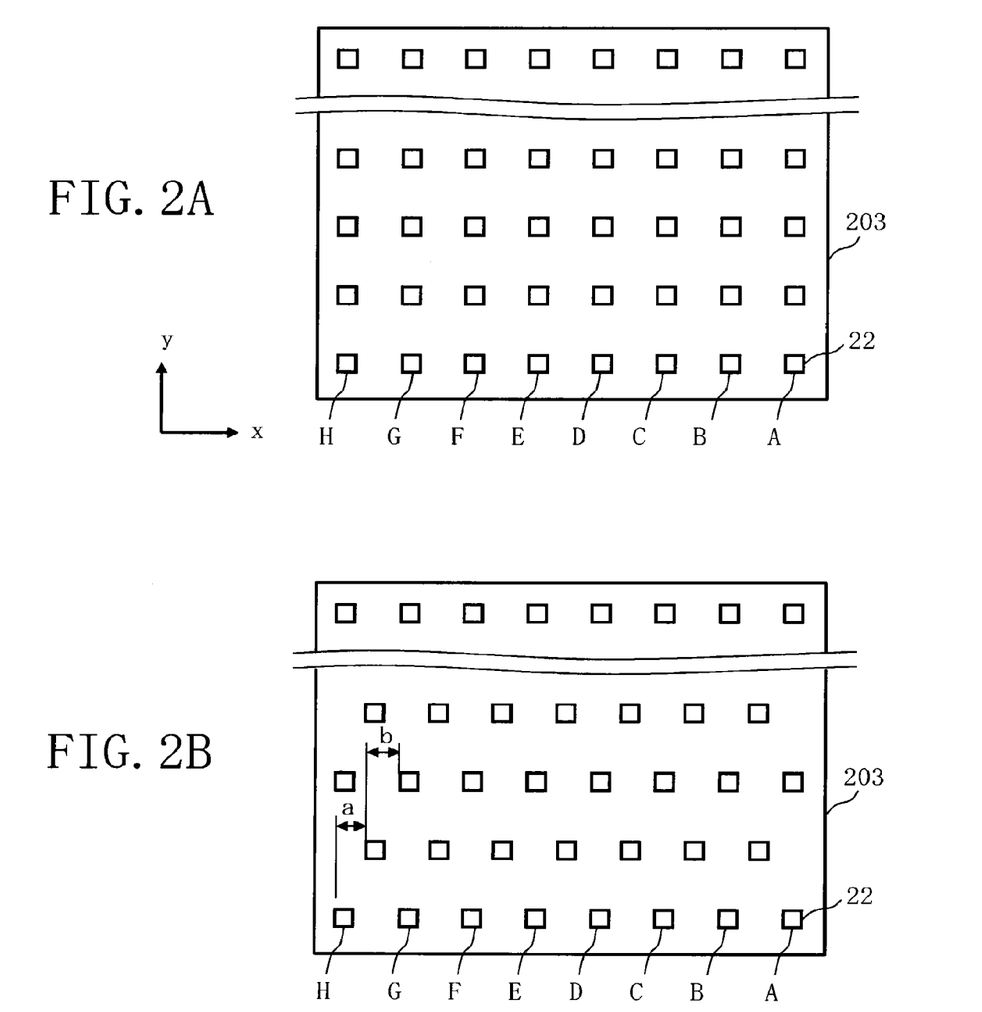
FIGS. 2A and 2B are conceptual diagrams each showing an example of the configuration of an aperture member according to the first embodiment.

FIGS. 2A and 2B are conceptual diagrams each showing an example of the configuration of an aperture member according to the first embodiment. As shown in FIG. 2A, holes (openings) 22 of m rows long (y direction) and n columns wide (x direction) (m≥2, n≥2) are formed, like a matrix, in the aperture member 203 at a predetermined arrangement pitch. In FIG. 2A, for example, holes 22 of 512 (rows)×8 (columns) are formed. Each of the holes 22 is a quadrangle of the same dimensional shape. Alternatively, each of the holes 22 can be a circle of the same circumference. Here, there is shown an example in which each of the rows that are arrayed in the y direction has eight holes 22 from A to H in the x direction. Multi-beams 20 are formed by letting portions of an electron beam 200 respectively pass through a corresponding hole of a plurality of holes 22. The case in which the holes 22 of two or more rows and columns are arranged in both the x and the y directions is shown here, but the arrangement is not limited thereto. For example, it is also acceptable that a plurality of holes 22 are arranged in only one row (x direction) or in only one column (y direction). That is, in the case of only one row, a plurality of holes 22 are arranged as a plurality of columns, and in the case of only one column, a plurality of holes 22 are arranged as a plurality of rows. Moreover, the method of arranging the holes 22 is not limited to the case of FIG. 2A where holes are arranged like a grid in the length and width directions. For example, as shown in FIG. 2B, as to the first and second rows arrayed in the length direction (y direction), each hole in the first row and each hole in the second row may be mutually displaced in the width direction (x direction) by a dimension "a". Similarly, as to the second and third rows arrayed in the length direction (y direction), each hole in the second row and each hole in the third row may be mutually displaced in the width direction (x direction) by a dimension "b", for example.

Figure 3:
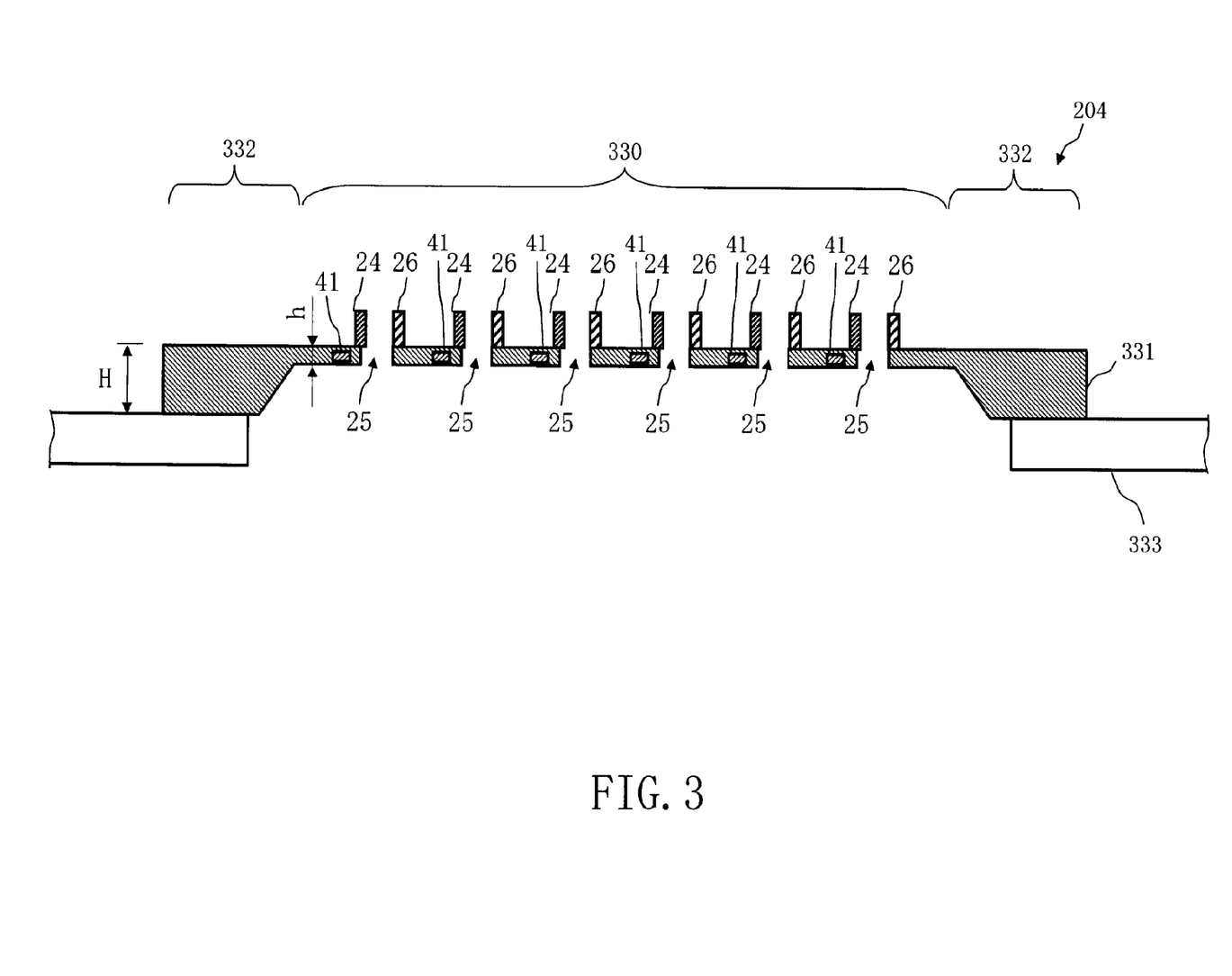
FIG. 3 is a sectional view showing the configuration of a blanking plate according to the first embodiment.
Figure 4:
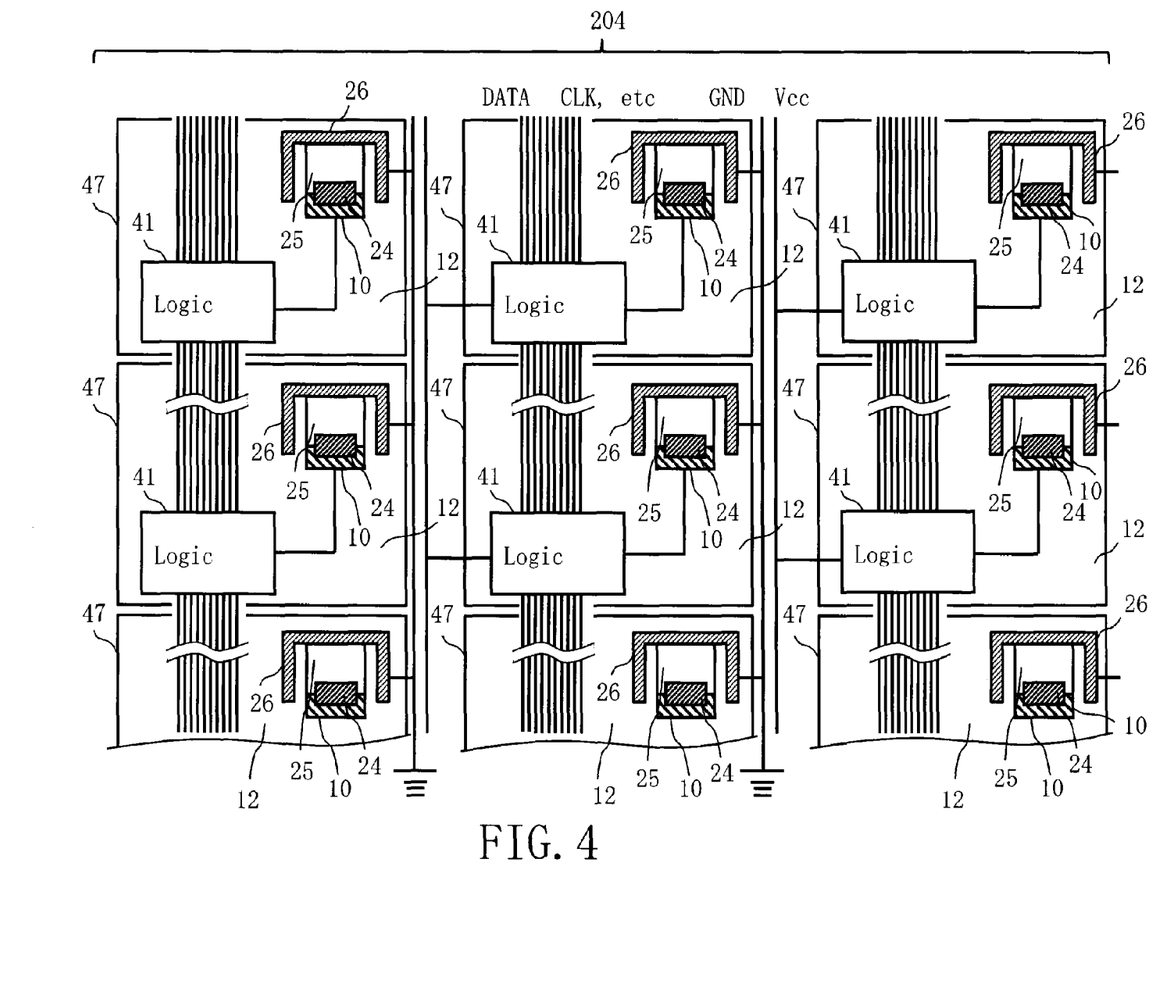
FIG. 4 is a top view conceptual diagram showing a part of the configuration in a membrane region of a blanking plate according to the first embodiment.

FIG. 3 is a sectional view showing the configuration of a blanking plate according to the first embodiment. FIG. 4 is a top view conceptual diagram showing a part of the configuration in a membrane region of a blanking plate according to the first embodiment. In FIGS. 3 and 4, the positions of electrodes 24 and 26 and the position of a control circuit 41 are not in accordance with each other. With regard to the configuration of the blanking plate 204 (blanking device), as shown in FIG. 3, a semiconductor substrate 331 made of silicon, etc. is placed on a support table 333. The central part of the substrate 331 is shaved from the back side and processed to be a membrane region 330 whose thin film thickness is h. The circumference surrounding the membrane region 330 is a circumference region 332 whose thick film thickness is H. The upper surface of the membrane region 330 and the upper surface of the circumference region 332 are formed to have equal height positions, or substantially equal height positions. At the backside of the circumference region 332, the substrate 331 is supported to be on the support table 333. The central part of the support table 333 is open, and the position of the membrane region 330 is located in the opening part of the support table 333.

In the membrane region 330, there are formed apertured passage holes 25 (openings) through which multi-beams respectively pass at the positions each corresponding to each hole 22 of the aperture member 203 shown in FIGS. 2A and 2B. In other words, a plurality of passage holes 25, through each of which a corresponding beam 20 of the multi-beams passes, are formed in a two-dimensional region of m rows long (y direction) and n columns wide (x direction) ($m \geq 2$, $n \geq 2$) in the substrate 331. Then, as shown in FIGS. 3 and 4, pairs of electrodes 24 and 26 (blanker: blanking deflector) for blanking deflection are arranged on the membrane region 330, and each of the pairs is close to and at opposite sides of a corresponding passage hole 25. Moreover, close to each passage hole 25 in the membrane region 330 of the substrate 331, there is arranged the control circuit 41 (logic circuit) for applying a deflection voltage to the control electrode 24, for example, for each passage hole 25. The other one (e.g., electrode 26) of the two electrodes 24 and 26 for each beam is earthed (grounded). Moreover, as shown in FIG. 4, for example, 10-bit parallel lines for control signals are connected to each control circuit 41. In addition to the 10-bit parallel lines, for example, lines for a power source, a control clock, etc. are connected to each control circuit 41. A part of the parallel lines may be used as the power source line. A separate blanking system 47 composed of the electrodes 24 and 26, and the control circuit 41 is configured for each beam of the multi-beams. A pad, etc. (not shown) for transmitting a control signal to each control circuit 41 are arranged in the circumference region 332 having a thick film thickness.

Figure 5A:
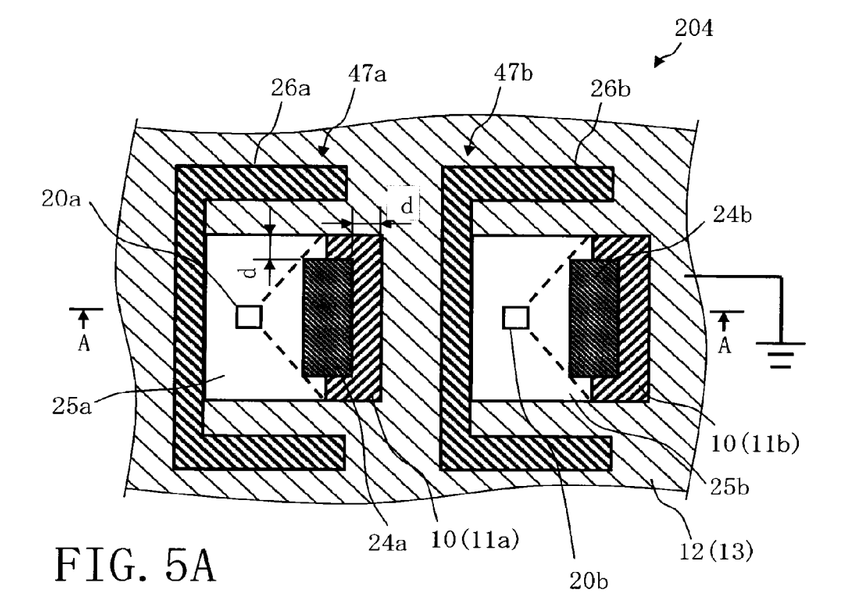
FIGS. 5A and 5B show a part of the blanking plate according to the first embodiment.
Figure 5B:
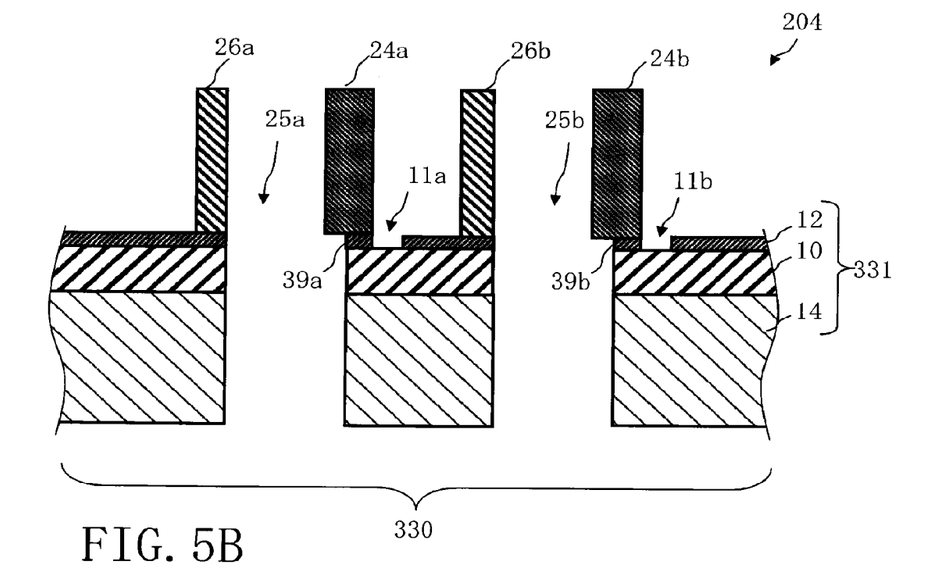

FIGS. 5A and 5B show a part of the blanking plate according to the first embodiment. FIG. 5A shows an example of the upper surface of two separate blanking systems 47. FIG. 5B shows an example of a sectional view at the position corresponding to each arrow A in FIG. 5A. The control circuit 41 of each separate blanking system 47 is formed in an Si substrate 14. The control circuit 41 is formed by the LSI technology. In FIG. 5B, depiction of the control circuit 41 of each separate blanking system 47 formed in the Si substrate 14 is omitted. A dielectric film 10 is formed on the Si substrate 14. The dielectric film 10 is formed for a protective film for LSI such as the control circuit 41 formed in the Si substrate 14, and the dielectric film 10 is formed, for example, as an interlayer dielectric film for a contact via wiring between the LSI and the electrode 24 (or a conducting film portion 39, at the lower part of the electrode 24, separated by a shadow region 11). For example, an oxide silicon ($SiO_2$) film is used as the dielectric film 10.

A conductive film 12 is formed on the dielectric film 10. It is preferable to use aluminum, gold, or the like, for example, as a material of the conductive film 12. The conductive film 12 is formed all over the dielectric film 10 by the spatter method, etc., for example. After the conductive film has been formed, a plurality of passage holes 25, through each of which a corresponding beam 20 of the multi-beams passes, are formed in a two-dimensional region of m rows long (y direction) and n columns wide (x direction) ($m \geq 2$, $n \geq 2$). With respect to the Si substrate 14 on which a resist pattern has been formed on the conductive film 12 through a lithography step, such as a resist applying step and an exposure step, a plurality of passage holes 25 can be formed approximately perpendicularly (e.g., vertically) against the surface of the Si substrate 14 by removing the exposed conductive film 12 and its underneath dielectric film 10 and Si substrate 14 by an anisotropic etching method. After a plurality of passage holes 25 have been formed, they are once embedded with a sacrificial film. Then, patterning processing is performed, and the shadow region (first region), to be described later, is removed by etching. The substrate 331 is configured, for example, by the laminated Si substrate 14, dielectric film 10, and conductive film 12. For example, the dielectric film 10 can be exposed in the shadow region (first region), to be described later, by removing the exposed conductive film 12 by an anisotropic etching method with respect to the substrate 331 for which a resist pattern has been formed on the conductive film 12 through a lithography step, such as a resist applying step and an exposure step. The conductive film 12 is arranged in, other than a plurality of shadow regions (first region) on the dielectric film 10 each along the electrode 24 and being shaded by the electrode 24, namely out of view, when viewed from a position where each corresponding beam 20 of the multi-beams passes through the corresponding passage hole 25, a region (second region) on the dielectric film 10. In the example of FIG. 5A, concerning the surrounding four sides of the electrode 24, one side opposite to the corresponding passage hole 25, and portions of both end sides of the one side, namely connected to the one side, are shaded by an electrode 24a (24b) when viewed from the position in a corresponding passage hole 25a (25b) through which a corresponding electron beam 20a (20b) passes. Therefore, the conductive film 12 in a shadow region 11a (11b) is removed to expose the dielectric film 10.

Then, on the conductive film 12 and partly exposed dielectric film 10, a film pattern (mask) is formed by a resist film or a sacrificial film in a region other than the region on which an electrode is to be formed by the patterning technique. In that case, patterning is performed such that a part of the electrode 24 projects toward the passage hole 25 side. In other words, a part of the sacrificial film embedded in the passage hole 25 is opened. The electrodes 24 and 26 for each beam are formed by depositing electrode materials by a spatter method, etc. on the conductive film 12 exposed in the region where an electrode is to be formed and on the exposed sacrificial film in the passage hole 25, and removing the film pattern by ashing or etching. The height (film thickness) of the electrodes 24 and 26 is set based on the amount of deflection necessary for blanking control of the electron beam 20. Aluminum, gold, or the like is preferably used as a material of the electrodes 24 and 26. From a viewpoint of a film forming process, it is preferable for the material of the electrodes 24 and 26 to be the same as that of the conductive film 12. It goes without saying that, before forming the electrodes 24 and 26 or simultaneously with the forming, a contact plug (not shown) for connecting the electrode 24 and the control circuit 41 (not shown) is formed from the upper side of the conductive film 12 to the control circuit 41 in the Si substrate 14. Then, later, the sacrificial film embedded in the passage hole 25 should be removed by a wet etching method, etc.

A plurality of electrodes 24 (first electrode) for multi-beams are arranged at the positions, each exposed in a corresponding passage hole 25 (corresponding opening) of a plurality of passage holes 25 (openings), on the conductive film 12 on the dielectric film 10. A plurality of electrodes 26 (second electrode) for multi-beams are arranged at the positions, each opposite to a corresponding electrode 24 of a plurality of electrodes 24 (first electrode) with respect to a corresponding passage hole 25, on the conductive film 12 on the dielectric film 10. FIG. 5A shows a case in which the electrode 24a (24b) is arranged at the position contacting with one side of a corresponding passage hole 25a (25b), and the electrode 26a (26b) is arranged at the opposite side of the corresponding passage hole 25a (25b). The electrode 26a (26b) is not necessarily in contact with the corresponding passage hole 25a (25b). The electrode 26 (second electrode) is preferably formed in the shape of a letter U.

Each electrode 24 is formed to partially project toward a corresponding passage hole 25 side. Although a beam is aligned at the middle point between the blanking electrode and the ground electrode, even if alignment is performed in a state where a beam is close to the blanking electrode side because of an alignment error, since the distance between the beam and the side wall (exposed dielectric film 10) is secured, charging of the side wall concerned is difficult to occur. As the deflection sensitivity decreases when a beam is moved to the ground side, an alignment is not performed at the position of the ground electrode side with respect to the middle point. Since each electrode 24 is formed to partially project toward a corresponding passage hole 25 side, each of a plurality of passage holes 25 is formed such that the ends of each of the plurality of passage holes 25 are in contact with three sides of the surrounding four sides of the electrode 24 which is corresponding to the passage hole 25, and to have a concave shape open to the right when viewed from the above. In the example of FIG. 5A, the passage hole 25 is formed such that its one side (facing side) faces the electrode 26 and its both the sides are in contact with the facing side. The corresponding passage hole 25 and the shadow region 11 are designed such that the exposed dielectric film 10 and the corresponding passage hole 25 contact with each other at the above-mentioned both sides of each electrode 24. Thereby, all the surrounding sides of each electrode 24 can be surrounded by the exposed dielectric film 10 in each shadow region 11, and the corresponding passage hole 25. Thus, insulation is provided between a plurality of electrodes 24 and a plurality of electrodes 26 by the combination between the exposed portion of the dielectric film 10 in each shadow region 11 and the corresponding passage hole 25. In other words, each of a plurality of passage holes 25 (opening) is formed in a concave shape perpendicularly to the passing beam, and the electrode 24 (first electrode) is arranged at the concave portion of the concave shape.

In each of a plurality of shadow regions 11 (first region) for a plurality of electrodes 24, the width d in the direction orthogonal to the direction along the electrode 24 is set to be a distance for preventing creeping discharge. In other words, the width d is formed such that the breakdown voltage of the dielectric film 10 is larger than a deflection voltage (difference between first and second deflection potentials). When the deflection voltage for blanking of each beam is 5V, if the breakdown voltage of the dielectric film 10 is 10 kV/mm, for example, it is necessary for the width d to be greater than or equal to 1 μm in order to secure the breakdown voltage of 10V, for example, which is larger than the deflection voltage 5V. By acquiring such width d in each shadow region 11 (first region), insulation can be achieved between a plurality of electrodes 24 and a plurality of electrodes 26 not to generate discharge even if a deflection voltage for blanking is applied between the electrodes 24 and 26.

Each electrode 24, at the time of beam OFF to be described later, is applied with a deflection potential (first deflection potential) for blanking deflection of a corresponding electron beam 20 of the multi-beams through the control circuit 41. On the other hand, each electrode 26 is applied with a deflection potential (second deflection potential), including a ground potential, for deflecting a corresponding electron beam 20 by a potential difference against the deflection potential (first deflection potential). According to the first embodiment, each electrode 26 is grounded (earthed) through the conductive film 12. Since the electrode 26 becomes a ground potential, when electrode 24 is a ground potential, beam becomes ON without being deflected, and when the electrode 24 is a certain voltage (e.g., 5V), beam is deflected to be OFF.

The blanking plate 204 is arranged below the aperture member 203. The electron beam 20 of FIG. 5A is a beam having passed through the opening of the aperture member 203, and the opening of the aperture member 203 exists above the position shown by the electron beam 20 of FIG. 5A. Since electron beams are scattered at the edge of the opening, the scattered electrons irradiate the blanking plate 204 in the range larger than the range shown as the electron beam 20 of FIG. 5A. Since the electrodes 24 and 26 block the scattered electrons, the range on the blanking plate 204 irradiated by the scattered electrons can be narrowed by reducing the space between the blanking plate 204 and the aperture member 203. However, the circumference of the opening 25 is inevitably irradiated with the scattered electrons.

The conductive film 12 and each electrode 26 are grounded. The electrode 24 is connected through a blanking voltage output circuit to the ground and the power source for supplying a blanking voltage, where the power source is arranged outside of the electron optical column 102. Therefore, even if scattered electrons irradiate the conductive film 12 and the electrodes 24 and 26 from above, since the electrons flow to the ground or the power source, they do not get charged. Each of the electrodes 24 and 26 has a height (film thickness) greater than the width d of the shadow region 11. Therefore, since the electrodes 24 and 26 are obstacles against the scattered electrons from above, the electrons do not reach the dielectric film 10 or can be suppressed to an ignorable amount (the number of electrons). Accordingly, charging of the exposed dielectric film 10 can be prevented or suppressed to an ignorable level. Thus, the charging of the dielectric film 10 by electron beams can be prevented by forming the passage hole 25 in a concave shape in order to limit the dielectric film 10 contacting with the electrode 26 to be an extent of the shadow region shaded by electrode 24 when viewed from the electron beam 20 passing through the opening 25.

By a simple method by virtue of configuring the blanking plate 204 (blanking device) as described above, charging of the blanking plate 204 by beam irradiation can be suppressed while securing insulation between a plurality of electrodes 24 and a plurality of electrodes 26. Therefore, beam distortion or blur resulting from charging can be prevented or reduced.

Furthermore, an overvoltage to the electrode, caused by charging, can be prevented, and breakage of the circuit 41 of the LSI circuit structure can be avoided.

The electron beam 20 passing through each passage hole 25 is deflected by deflection voltages each independently applied to each of the pair of the two electrodes 24 and 26. Blanking control is provided by this deflection. Each of a plurality of blankers performs blanking deflection of a corresponding beam in multi-beams respectively having passed through a plurality of holes 22 (openings) of the aperture member 203

Figure 6:
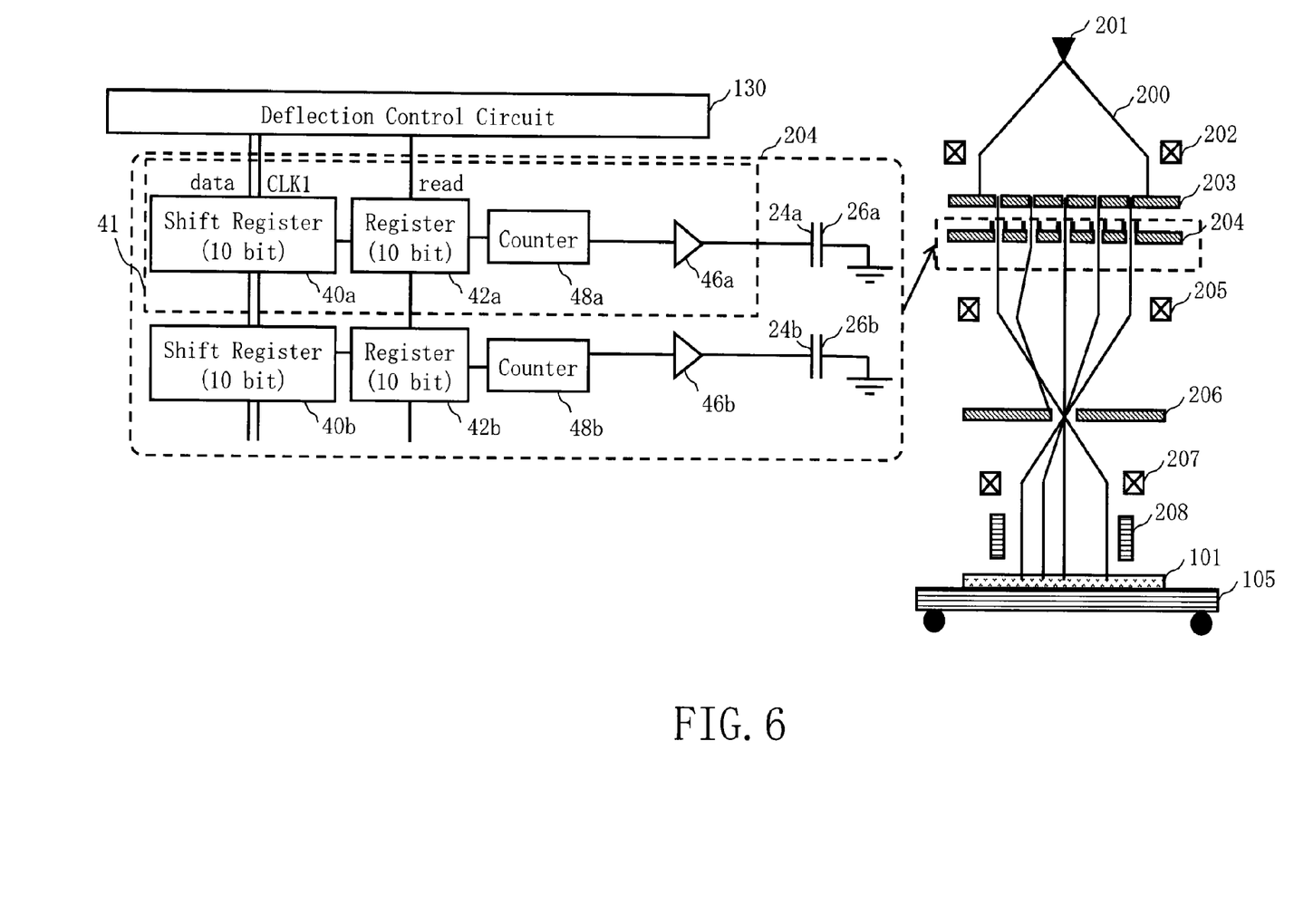
FIG. 6 is a schematic diagram showing the internal configuration of an individual blanking control circuit according to the first embodiment.

FIG. 6 is a schematic diagram showing the internal configuration of an individual blanking control circuit according to the first embodiment. In FIG. 6, in each control circuit 41 for individual blanking control arranged at the blanking plate 204 inside the body of the writing apparatus 100, there are arranged the shift register 40, a register 42, a counter 48, and an amplifier 46. According to the first embodiment, individual blanking control for each beam is controlled by a 10-bit control signal, for example. As shown in FIG. 6, when mounting the blanking plate 204 shown in FIG. 3 in the writing apparatus 100, it is preferable to arrange the surface, where the control circuit 41 and the electrodes 24 and 26 are formed, to be upward. The separate blanking systems 47 arrayed in two dimensions on the blanking plate 204 are grouped into groups each in each row or each column, for example. The shift register 40 in each control circuit 41 in the same group is connected in series.

The control computer 110 reads writing data from the storage device 140, and calculates the area density of a pattern arranged in each mesh region of a plurality of mesh regions obtained by virtually dividing the writing region of the target object 101 or a chip region to be written into meshes. For example, the writing region of the target object 101 or a chip region to be written is divided into strip-shaped stripe regions each having a predetermined width. Then, each stripe region is virtually divided into a plurality of mesh regions described above. Preferably, the size of a mesh region is, for example, a beam size, or smaller than a beam size. For example, the size of a mesh region is preferably about 10 nm. An area density calculation unit 60 reads corresponding writing data from the storage device 140 for each stripe region, and assigns a plurality of figure patterns defined in the writing data to a mesh region, for example. Then, the area density of a figure pattern arranged in each mesh region is calculated.

Moreover, the control calculator 110 calculates an irradiation time T (which hereinafter will also be called a shot time or an exposure time) of the electron beam per shot, for each predetermined sized mesh region. When performing multi-pass writing, an irradiation time T of the electron beam per shot in each hierarchy (or "each writing process") of multi-pass writing is calculated. It is preferable to obtain the irradiation time T, being a reference, to be in proportion to the area density of a calculated pattern. Moreover, it is preferable that the irradiation time T to be finally calculated is a time equivalent to a dose after correction, that is a dose having been corrected with respect to a dimension change amount for a phenomenon causing dimension variations (not shown), such as a proximity effect, a fogging effect, or a loading effect. The size of a plurality of mesh regions for defining the irradiation time T and the size of a plurality of mesh regions where a pattern area density has been defined may be the same size or different sizes. When they are different sizes, each irradiation time T should be calculated after interpolating the area density by linear interpolation, etc. The irradiation time T for each mesh region is defined in an irradiation time map, and the irradiation time map is stored in the storage device 142, for example.

Moreover, the control calculator 110 reads data of an irradiation time for a mesh region to be irradiated with each beam, stored in the storage device 142, converts the data of the irradiation time of a corresponding beam to 10-bit data, for each group of a plurality of shift registers connected in series, and performs processing so that the data may be aligned according to the order to be transmitted by a plurality of shift registers 40 of a corresponding group. The arrangement processing is performed so that the data may be aligned in order from the data for a shift register at the posterior side in a plurality of shift registers connected in series in the group.

Moreover, the control calculator 110 outputs, for each beam shot, irradiation time arrangement data whose order has been processed to be in accordance with the order of a plurality of groups of shift registers connected in series, to the deflection control circuit 130.

The deflection control circuit 130 outputs, for each shot, irradiation time arrangement data to the control circuit 41 corresponding to each group of arranged shift registers connected in series. The irradiation time arrangement data is serially transmitted.

According to the first embodiment, as shown in FIG. 6, since the shift register 40 is used in the control circuit 41, the deflection control circuit 130 transmits, in the case of data transmission, each 10-bit data configuring the same group to a pad (not shown) for a group concerned of the blanking plate 204 in order of arrangement (or in order of identification numbers) of the shift registers 40 connected in series. Each pad converts the signal having been serially transmitted into a 10-bit parallel signal for each beam, for example, and performs data transmission of the 10-bit parallel signal to a corresponding control circuit 41. Moreover, a clock signal (CLK1) for synchronization and a read signal (read) for data read-out are also output. The shift register 40 of each beam transmits, according to a clock signal (CLK1), data 10 bits by 10 bits in order from the higher side to a next shift register 40 sequentially.

Next, when inputting a read signal (read), the register 42 for each beam reads data of each beam from the shift register 40. When inputting 10-bit data, the individual register 42 for each beam outputs an ON/OFF signal to the counter 48, based on the data. If the signal from the register 42 is ON, the counter 48 counts an irradiation time and outputs an ON signal to the amplifier 46 during the irradiation time. While receiving the ON signal, the amplifier 46 applies an ON voltage to the electrode 24 of the individual blanking deflector. In other cases, the counter 48 outputs an OFF signal to the amplifier 46, and the amplifier 46 applies an OFF voltage to the electrode 24 of the individual blanking deflector.

The writing unit 150 performs writing during an irradiation time concerned, for each beam shot. Specifically, it operates as described below.

The electron beam 200 emitted from the electron gun assembly 201 (emission unit) almost perpendicularly illuminates the whole of the aperture member 203 by the illumination lens 202. A plurality of holes (openings), each being a quadrangle, are formed in the aperture member 203. The region including all the plurality of holes is irradiated with the electron beam 200. For example, a plurality of quadrangular electron beams (multiple beams) 20a to 20e are formed by letting parts of the electron beam 200 irradiating the positions of a plurality of holes pass through a corresponding hole of the plurality of holes of the aperture member 203 respectively. The multiple beams 20a to 20e respectively pass through a corresponding blanker (first deflector: individual blanking system) of the blanking plate 204. Each blanker respectively deflects (performs blanking deflection) the electron beam 20 passing individually.

The multi-beams 20a, 20b, . . . , 20e having passed through the blanking plate 204 are reduced by the reducing lens 205, and travel toward the hole in the center of the limiting aperture member 206. At this time, the electron beam 20 deflected by the electrodes 24 and 26 (blanker) of the blanking plate 204 deviates from the hole in the center of the limiting aperture member 206 (blanking aperture member) and is blocked by the limiting aperture member 206. On the other hand, the electron beam 20 which was not deflected by the electrodes 24 and 26 (blanker) of the blanking plate 204 passes through the hole in the center of the limiting aperture member 206 as shown in FIG. 1. Blanking control is performed by ON/OFF of the separate blanking system in order to control ON/OFF of the beam. Thus, the limiting aperture member 206 blocks each beam which was deflected to be beam OFF by the separate blanking system. One beam shot is formed by a beam which has been formed during from a beam ON state to a beam OFF state and has passed through the limiting aperture member 206. The multi beams 20 having passed through the limiting aperture member 206 are focused by the objective lens 207 in order to be a pattern image of a desired reduction ratio, and respective beams (the entire multi-beams 20) having passed through the limiting aperture member 206 are collectively deflected in the same direction by the deflector 208 so as to irradiate respective writing positions (irradiation positions) on the target object 101. Moreover, for example, while the XY stage 105 is continuously moving, the deflector 208 controls such that irradiation positions of beams follow the movement of the XY stage 105. The position of the XY stage 105 is measured by using a reflected light which is obtained by irradiating a laser onto the mirror 210 on the XY stage 105 from the stage position detector 139. Ideally, multi-beams 20 to irradiate at a time are aligned at pitches obtained by multiplying the arrangement pitch of a plurality of holes of the aperture member 203 by the desired reduction ratio described above. The writing apparatus 100 executes a writing operation by the raster scan method that sequentially performs irradiation of a shot beam in order, and when writing a desired pattern, a beam needed according to a pattern is controlled to be beam ON by blanking control.

Figure 7:
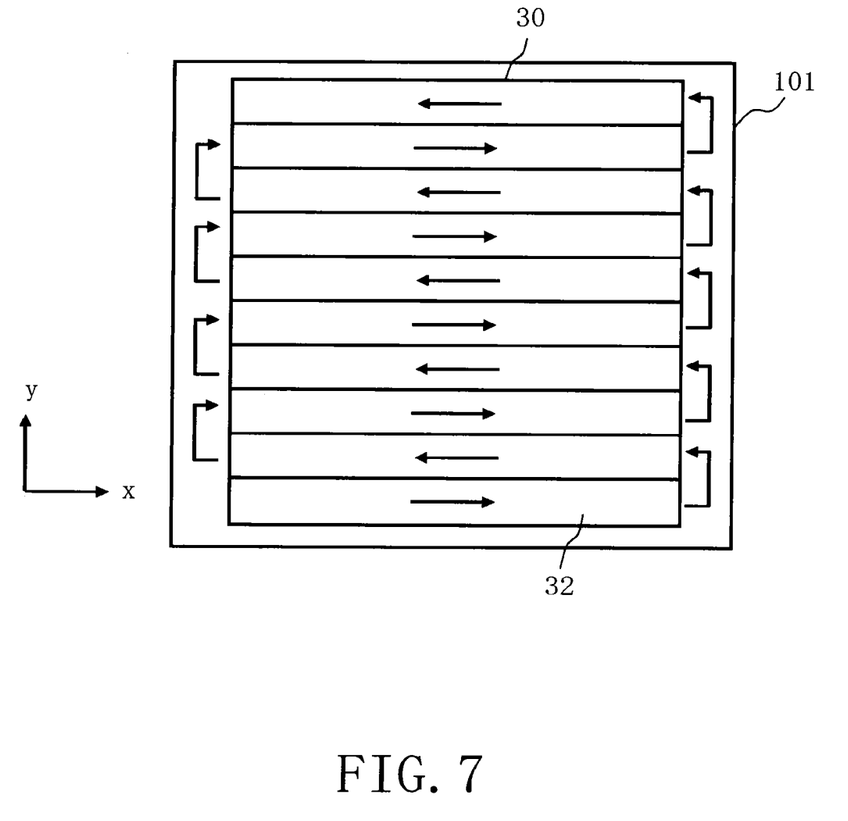
FIG. 7 is a conceptual diagram explaining an example of a writing operation according to the first embodiment.

FIG. 7 is a conceptual diagram explaining an example of a writing operation according to the first embodiment. As shown in FIG. 7, a writing region 330 of the target object 101 is virtually divided into a plurality of stripe regions 332 each in a strip shape and each having a predetermined width in the y direction, for example. Each of the stripe regions 332 serves as a unit region for writing. First, the XY stage 105 is moved to make an adjustment such that an irradiation region 34 which can be irradiated by one irradiation of the multi-beams 20 is located at the left end of the first stripe region 332 or at a position more left than the left end, and then writing is started. When writing the first stripe region 332, by moving the XY stage 105 in the −x direction, for example, the writing advances relatively in the x direction. The XY stage 105 is, for example, continuously moved at a predetermined speed. After writing the first stripe region 332, the stage position is moved in the −y direction to make an adjustment such that the irradiation region 34 is located at the right end of the second stripe region 332 or at a position more right than the right end to be relatively located in the y direction. Then, similarly, by moving the XY stage 105 in the x direction, for example, writing advances in the −x direction. That is, writing is performed while alternately changing the direction, such as performing writing in the x direction in the third stripe region 332, and in the −x direction in the fourth stripe region 332, and thus, the writing time can be reduced. However, the writing operation is not limited to the case of performing writing while alternately changing the direction, and it is also preferable to perform writing in the same direction when writing each stripe region 332. By one shot, a plurality of shot patterns whose number is equal to the number of the holes 22 are formed at a time by multi-beams which have been formed by passing through respective corresponding holes 22 of the aperture member 203.

As described above, according to the first embodiment, charging of the surface of the blanking device by beam irradiation can be suppressed while securing insulation between a plurality of electrodes 24 and a plurality of electrodes 26, by the combination of the dielectric film 10 and the corresponding passage hole 25.

Second Embodiment

In the first embodiment, there has been described the structure in which, with respect to the conductive film 12 formed on the surface of the blanking plate 204, the conductive film 12 in the shadow region 11, which insulates the electrode 24 from the conductive film 12 by the combination with the passage hole 25, is removed to expose the dielectric film 10. However, it is not limited thereto. In the second embodiment there will be described a structure which is further processed. The structure of the writing apparatus 100 of the second embodiment is the same as that of FIG. 1. The contents of the second embodiment are the same as those of the first embodiment except what is described below.

Figure 8A:
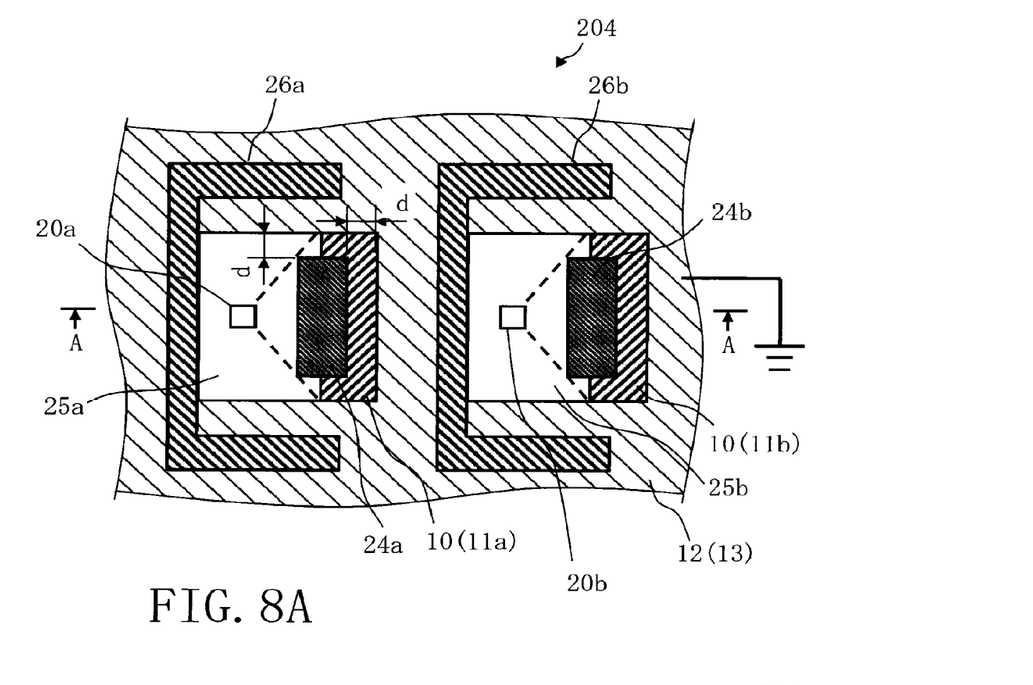
FIGS. 8A and 8B show a part of the blanking plate according to the second embodiment.
Figure 8B:
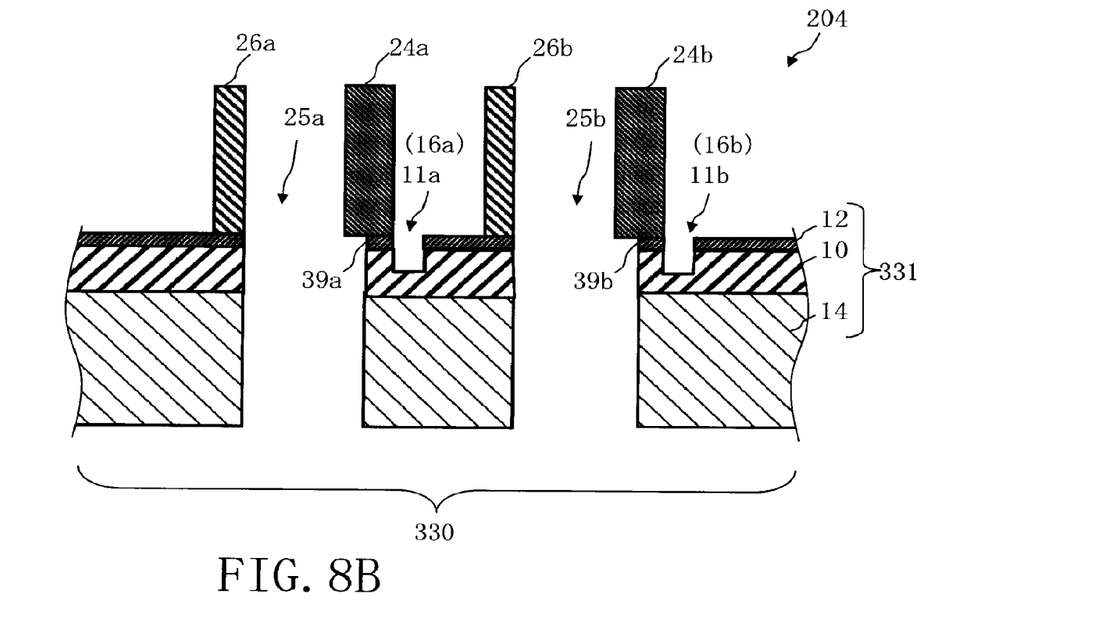

FIGS. 8A and 8B show a part of the blanking plate according to the second embodiment. FIG. 8A shows an example of the upper surface of two separate blanking systems 47. FIG. 8B shows an example of a sectional view at the position corresponding to FIG. 8A. The control circuit 41 of each separate blanking system 47 is formed in the Si substrate 14. The control circuit 41 is formed by LSI technology. In FIG. 8B, depiction of the control circuit 41 of each separate blanking system 47 formed in the Si substrate 14 is omitted. As shown in FIGS. 8A and 8B, a groove-like opening 16 is formed, along the electrode 24, in each of a plurality of shadow regions 11 (first region) in the dielectric film 10. The other respects are the same as those of FIGS. 5A and 5B. The depth of the opening 16 is formed to be the same length as the width d of the shadow region 11, for example. However, it is not limited thereto. The depth of opening 16 may be shorter or longer than the width d of the shadow region 11. Preferably, it is greater than or equal to d/2, and more preferably, greater than or equal to d. The creeping distance can be increased by virtue of forming the opening 16. If the depth of the opening 16 is d/2, the creeping distance is 2d which is obtained by adding d/2 being the distance of one side of the opening, d being the width of the bottom of the opening, and d/2 being the distance of the other side of the opening. Thus, the creeping distance can be made to be twice that of the first embodiment. If the depth of the opening 16 is d, the creeping distance is 3d, which is thus made to be three times that of the first embodiment.

Therefore, according to the second embodiment, in addition to the effects of the first embodiment, the countermeasures to the creeping discharge can be further enhanced than that of the first embodiment.

The forming method is to perform a patterning process for the conductive film 12 which has been formed, and perform etching to remove the conductive film 12 in the shadow region 11 (first region), which is followed by an etch of the shadow region 11 to form the opening 16.

Third Embodiment

In the first and second embodiments, there has been described the structure in which the dielectric film 10 is exposed in the shadow region 11. However, it is not limited thereto. In the third embodiment, there will be described a structure in which a conductive film is exposed even in the shadow region 11. The structure of the writing apparatus 100 of the third embodiment is the same as that of FIG. 1. The contents of the third embodiment are the same as those of the first embodiment except what is described below.

Figure 9A:
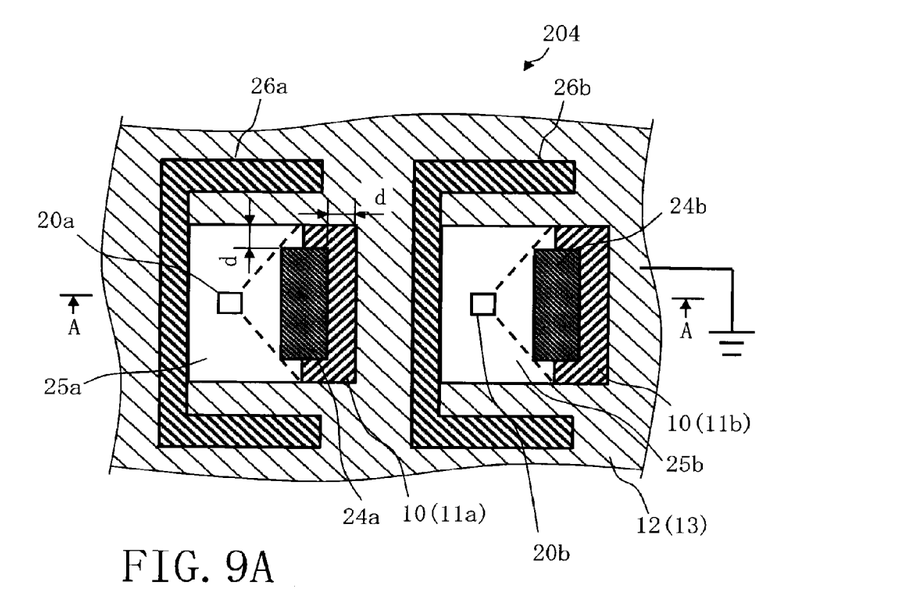
FIGS. 9A and 9B show a part of the blanking plate according to the third embodiment.
Figure 9B:
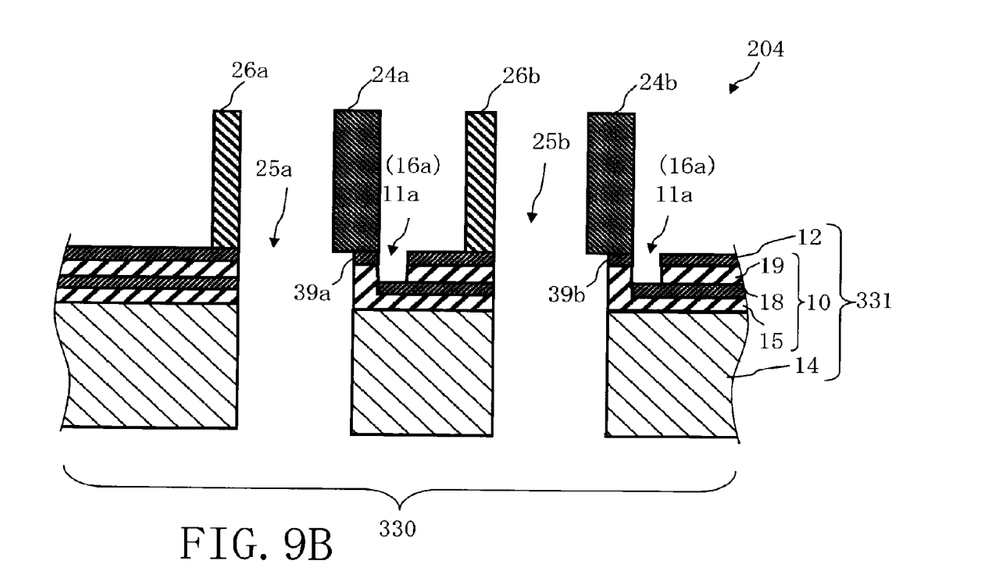

FIGS. 9A and 9B show a part of the blanking plate according to the third embodiment. FIG. 9A shows an example of the upper surface of two separate blanking systems 47. FIG. 9B shows an example of a sectional view at the position corresponding to FIG. 9A. The control circuit 41 of each separate blanking system 47 is formed in the Si substrate 14. The control circuit 41 is formed by LSI technology. In FIG. 9B, depiction of the control circuit 41 of each separate blanking system 47 formed in the Si substrate 14 is omitted.

According to the third embodiment, as the dielectric film 10, two films, a lower dielectric film 15 and an upper dielectric film 19, are formed. Then, a conductive film 18 is formed between the lower dielectric film 15 and the upper dielectric film 19 with respect to the region other than the region where each electrode 24 is formed.

The forming method is as described below. The dielectric film 15 is formed on the Si substrate 14, and for example, formed all over the Si substrate 140. As the dielectric film 15, an oxide silicon ($SiO_2$) film is used, for example.

The conductive film 18 is formed on the dielectric film 15. As the material of the conductive film 18, it is preferable to use aluminum, gold or the like, for example. The conductive film 18 is formed all over the dielectric film 15 by the spatter method, etc., for example, and then, is patterning processed to be removed by etching with respect to the region where each electrode 24 is formed.

The dielectric film 19 is formed on the dielectric film 15, a part of which is exposed, and the conductive film 18. The dielectric film 19 is formed all over the Si substrate 14, for example. As the dielectric film 19, an $SiO_2$ film is used, for example.

Then, the conductive film 12 is formed on the dielectric film 19. After the conductive film 12 is formed, patterning process is performed for the conductive film 12 to be removed by etching with respect to the shadow region 11 (first region). Then, the opening 16 is formed along the electrode 24 by removing the dielectric film 19 by etching until the conductive film 18 is exposed with respect to the shadow region 11 (first region). The subsequent steps are the same as those of the first embodiment.

By what is described above, as shown in FIGS. 9A and 9B, it can be configured such that the conductive film 18 (second conductive film) is arranged between the dielectric film 15 (Si substrate 14) and the dielectric film 19, and exposed at the bottom of the groove-like opening 16. In addition, the conductive film 18 is grounded (earthed). The other respects are the same as those of FIGS. 5A and 5B. Since it is necessary to make the creeping distance greater than or equal to the dimension d in order to prevent creeping discharge, the film thickness of the dielectric film 19 should be greater than or equal to d/2. Thereby, the creeping distance can be made to be d which is the total of d/2 being the distance of one side of the opening and d/2 being the distance of the other side of it. More preferably, the film thickness of the dielectric film 19 is greater than or equal to d.

As described above, according to the third embodiment, the conductive film 18 can be exposed also with respect to the shadow region 11. Therefore, the surface of the blanking plate 204, which may be irradiated by beams or scattered electrons, can be covered by the conductive film. Thus, according to the third embodiment, in addition to the effects of the first embodiment, the risk of charging of the shadow region 11 can be avoided. Moreover, since the creeping distance can be lengthened by increasing the depth of the opening 16, the countermeasures to the creeping discharge can be further enhanced than that of the first embodiment.

Embodiments have been explained referring to concrete examples described above. However, the present invention is not limited to these specific examples. While the case of inputting a 10-bit control signal into the shift register 40 has been described above, the number of bits may be suitably set. For example, a 2-bit (or 3 to 9 bit) control signal may be used. Further, a control signal of 11-bit or more may also be used. Moreover, although, in the example described above, the electrode 24 is formed to project in the quadrangular passage hole 25, it is not limited thereto. The passage hole 25 (opening) may be a concave-hole shape (being concave toward the electrode 24 side).

What is necessary is that the shadow region and the side wall of the dielectric film exposed in the passage hole 25 are hidden (not viewed) from the beam center by the electrode 24.

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

In addition, any other blanking device, and multi charged particle beam writing apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A blanking device for multi charged particle beams comprising:
   a substrate in which there are formed a plurality of openings through each of which a corresponding beam of multi-beams passes;
   a dielectric film formed on the substrate;
   a plurality of first electrodes, located at an upper side of the dielectric film and arranged at positions each exposed in a corresponding opening of the plurality of openings, each configured to be applied with a first deflection potential for blanking deflection of the corresponding beam of the multi-beams;
   a plurality of second electrodes, located at the upper side of the dielectric film and arranged at positions each opposite to a corresponding first electrode of the plurality of first electrodes with respect to the corresponding opening of the plurality of openings, each configured to be applied with a second deflection potential, including a ground potential, for deflecting the corresponding beam of the multi-beams by a potential difference between the first deflection potential and the second deflection potential; and a conductive film arranged in, other than a plurality of first regions on the dielectric film each along a corresponding first electrode of the plurality of first electrodes and being shaded by the each of the plurality of first electrodes in a case of being viewed from a position where the corresponding beam passes through the corresponding opening of the plurality of openings, a second region on the dielectric film, wherein insulation is provided between the each of the plurality of first electrodes and the plurality of second electrodes by combination of the dielectric film and the corresponding opening.

2. The device according to claim 1, wherein each of the plurality of openings is formed in a quadrangular shape perpendicular to a passing beam of the multi-beams, and the each of the plurality of first electrodes is arranged to project in the corresponding opening.

3. The device according to claim 1, wherein a groove-like opening is formed in each of the plurality of first regions in the dielectric film.

4. The device according to claim 3, further comprising:
a second conductive film arranged between the substrate and the dielectric film, and exposed at a bottom surface of the groove-like opening.

5. The device according to claim 1, wherein each of the plurality of openings is formed such that three sides of surrounding four sides of the corresponding first electrode of the plurality of first electrodes are exposed in the corresponding opening.

6. The device according to claim 1, wherein a width of each of the plurality of first regions, where the width is orthogonal to a direction along the corresponding first electrode, is set such that a breakdown voltage of the dielectric film is larger than a difference between the first deflection potential and the second deflection potential.

7. The device according to claim 1, wherein the dielectric film is exposed in the plurality of first regions.

8. The device according to claim 7, wherein the dielectric film in each of the plurality of first regions is exposed along three sides of surrounding four sides of the each of the plurality of first electrodes corresponding to the each of the plurality of first regions.

9. The device according to claim 1, wherein the each of the plurality of first electrodes is surrounded by an exposed portion of the dielectric film and the corresponding opening of the plurality of openings in order not to contact with the conductive film.

10. The device according to claim 1, wherein each of the plurality of openings is formed in a concave shape perpendicular to a passing beam of the multi-beams, and the each of the plurality of first electrodes is arranged at a concave portion of the concave shape.

11. A multi charged particle beam writing apparatus comprising:

a stage configured to mount a target object thereon and to be continuously movable;

an emission unit configured to emit a charged particle beam;

an aperture member, in which a plurality of openings are formed, configured to form multi-beams by making a region including a whole of the plurality of openings irradiated by the charged particle beam and letting portions of the charged particle beam respectively pass through a corresponding opening of the plurality of openings;

a blanking device including
a substrate in which there are formed a plurality of openings through each of which a corresponding beam of multi-beams passes,
a dielectric film formed on the substrate,
a plurality of first electrodes, located at an upper side of the dielectric film and arranged at positions each exposed in a corresponding opening of the plurality of openings, each configured to be applied with a first deflection potential for blanking deflection of the corresponding beam of the multi-beams,
a plurality of second electrodes, located at the upper side of the dielectric film and arranged at positions each opposite to a corresponding first electrode of the plurality of first electrodes with respect to the corresponding opening of the plurality of openings, each configured to be applied with a second deflection potential, including a ground potential, for deflecting the corresponding beam of the multi-beams by a potential difference between the first deflection potential and the second deflection potential, and
a conductive film arranged in, other than a plurality of first regions on the dielectric film each along each of the plurality of first electrodes and being shaded by the each of the plurality of first electrodes in a case of being viewed from a position where the corresponding beam passes through the corresponding opening of the plurality of openings, a second region on the dielectric film,
wherein insulation is provided between the each of the plurality of first electrodes and the plurality of second electrodes by combination of the dielectric film and the corresponding opening; and a blanking aperture member configured to block each beam of the multi-beams which has been deflected to be in an OFF state by the plurality of first electrodes and the plurality of second electrodes of the blanking device.

* * * * *